(12) United States Patent
Karda et al.

(10) Patent No.: US 11,164,889 B2
(45) Date of Patent: *Nov. 2, 2021

(54) INTEGRATED ASSEMBLIES HAVING FERROELECTRIC TRANSISTORS WITH HETEROSTRUCTURE ACTIVE REGIONS

(71) Applicant: Micron Technology, Inc., Boise, ID (US)

(72) Inventors: Kamal M. Karda, Boise, ID (US); Durai Vishak Nirmal Ramaswamy, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/235,848

(22) Filed: Apr. 20, 2021

(65) Prior Publication Data

US 2021/0242221 A1 Aug. 5, 2021

Related U.S. Application Data

(63) Continuation of application No. 16/188,432, filed on Nov. 13, 2018, now Pat. No. 10,998,338.

(51) Int. Cl.
*G11C 11/22* (2006.01)
*H01L 27/1159* (2017.01)
(Continued)

(52) U.S. Cl.
CPC ........ *H01L 27/1159* (2013.01); *G11C 11/223* (2013.01); *G11C 11/2257* (2013.01);
(Continued)

(58) Field of Classification Search
CPC ..... G06F 3/0659; G06F 3/0656; G11C 7/109; G11C 16/32; G11C 16/08; G11C 16/24;
(Continued)

(56) References Cited

U.S. PATENT DOCUMENTS 7,727,843 B2 6/2010 Ishihara et al.
9,269,785 B2 2/2016 Mueller et al.
(Continued)

FOREIGN PATENT DOCUMENTS

TW 201533888 9/2015
TW 108138935 7/2020
(Continued)

*Primary Examiner* — Hoai V Ho
*Assistant Examiner* — Minh Dinh
(74) *Attorney, Agent, or Firm* — Wells St. John P.S.

(57) ABSTRACT

Some embodiments include a ferroelectric transistor having an active region which includes a first source/drain region, a second source/drain region, and a body region between the first and second source/drain regions. The body region has a different semiconductor composition than at least one of the first and second source/drain regions to enable replenishment of carrier within the body region. An insulative material is along the body region. A ferroelectric material is along the insulative material. A conductive gate material is along the ferroelectric material.

23 Claims, 10 Drawing Sheets

(51) Int. Cl.
*H01L 29/78* (2006.01)
*H01L 29/165* (2006.01)
*H01L 29/08* (2006.01)
*H01L 27/11592* (2017.01)
*H01L 29/10* (2006.01)

(52) U.S. Cl.
CPC .... *G11C 11/2273* (2013.01); *H01L 27/11592* (2013.01); *H01L 29/0847* (2013.01); *H01L 29/1095* (2013.01); *H01L 29/165* (2013.01); *H01L 29/7827* (2013.01); *H01L 29/78391* (2014.09)

(58) Field of Classification Search
CPC ... G11C 7/1063; G11C 7/1051; G11C 7/1078; G11C 16/0483; G11C 16/26

USPC .......................................................... 365/145

See application file for complete search history.

(56) References Cited

U.S. PATENT DOCUMENTS

| | | |
|---|---|---|
| 10,998,338 B2 * | 5/2021 | Karda ................. G11C 11/2275 |
| 2004/0129987 A1 | 7/2004 | Uchiyama et al. |
| 2007/0272959 A1 | 11/2007 | Hidaka et al. |
| 2010/0140589 A1 | 6/2010 | Ionescu |
| 2010/0200916 A1 | 8/2010 | Gossner et al. |
| 2015/0214322 A1 | 7/2015 | Mueller et al. |
| 2015/0287802 A1 | 10/2015 | Lee |
| 2015/0311286 A1 | 10/2015 | Lee et al. |
| 2016/0087098 A1 | 3/2016 | Liu et al. |
| 2017/0309322 A1 | 10/2017 | Ramaswamy et al. |
| 2017/0358599 A1 | 12/2017 | Ramaswamy et al. |
| 2018/0301533 A1 | 10/2018 | Avci et al. |
| 2019/0348424 A1 | 11/2019 | Karda et al. |
| 2020/0035704 A1 | 1/2020 | Kinney |

FOREIGN PATENT DOCUMENTS

| | | |
|---|---|---|
| WO | WO PCT/US2019/056135 | 2/2020 |
| WO | WO PCT/US2019/056135 | 5/2021 |

* cited by examiner

INTEGRATED ASSEMBLIES HAVING FERROELECTRIC TRANSISTORS WITH HETEROSTRUCTURE ACTIVE REGIONS

RELATED PATENT DATA

This patent resulted from a continuation of U.S. patent application Ser. No. 16/188,432 filed Nov. 13, 2018, now U.S. Pat. No. 10,998,338, which is hereby incorporated by reference herein.

TECHNICAL FIELD

Integrated Assemblies having ferroelectric transistors with heterostructure active regions.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or nonvolatile. Nonvolatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Ferroelectric field effect transistors (FeFET) may be utilized as memory cells. Specifically, the FeFETs may have two selectable memory states corresponding to two different polarization modes of ferroelectric material within the FeFETS. The different polarization modes may be characterized by, for example, different threshold voltages (Vt) or by different channel conductivities for a selected operating voltage. The ferroelectric polarization mode of a FeFET may remain in the absence of power (at least for a measurable duration).

One type of ferroelectric transistor is a metal-ferroelectric-metal-insulator-semiconductor (MFMIS) transistor. Such has a gate dielectric (insulator, I) between metal (M) and a semiconductor substrate (S). Such also has ferroelectric (F) material over the metal, and has a gate (typically comprising metal, M) over the ferroelectric material. In operation, an electric field across the ferroelectric material is used to switch the ferroelectric material from one polarization mode to another. The ferroelectric transistor comprises a pair of source/drain regions, and a channel region between the source/drain regions. Conductivity across the channel region is influenced by the polarization mode of the ferroelectric material. Another type of ferroelectric transistor is metal-ferroelectric-insulator-semiconductor (MFIS); in which ferroelectric material directly touches the insulator (i.e., in which there is no intervening metal between the ferroelectric material and the insulator).

The channel region may be considered to be contained within a body region of the ferroelectric transistor. During programming operations, carriers (holes and electrons) migrate into and out of the body region.

It is desired to develop ferroelectric transistors which may be rapidly programmed, and yet which are scalable to ever-increasing levels of integration. It is proving difficult to achieve desired rapid programming with conventional ferroelectric transistor configurations.

It would be desirable to develop new ferroelectric transistors which address the above-discussed problem, and to develop new memory array architectures utilizing such transistors.

DETAILED DESCRIPTION OF THE ILLUSTRATED EMBODIMENTS

Figure 1:
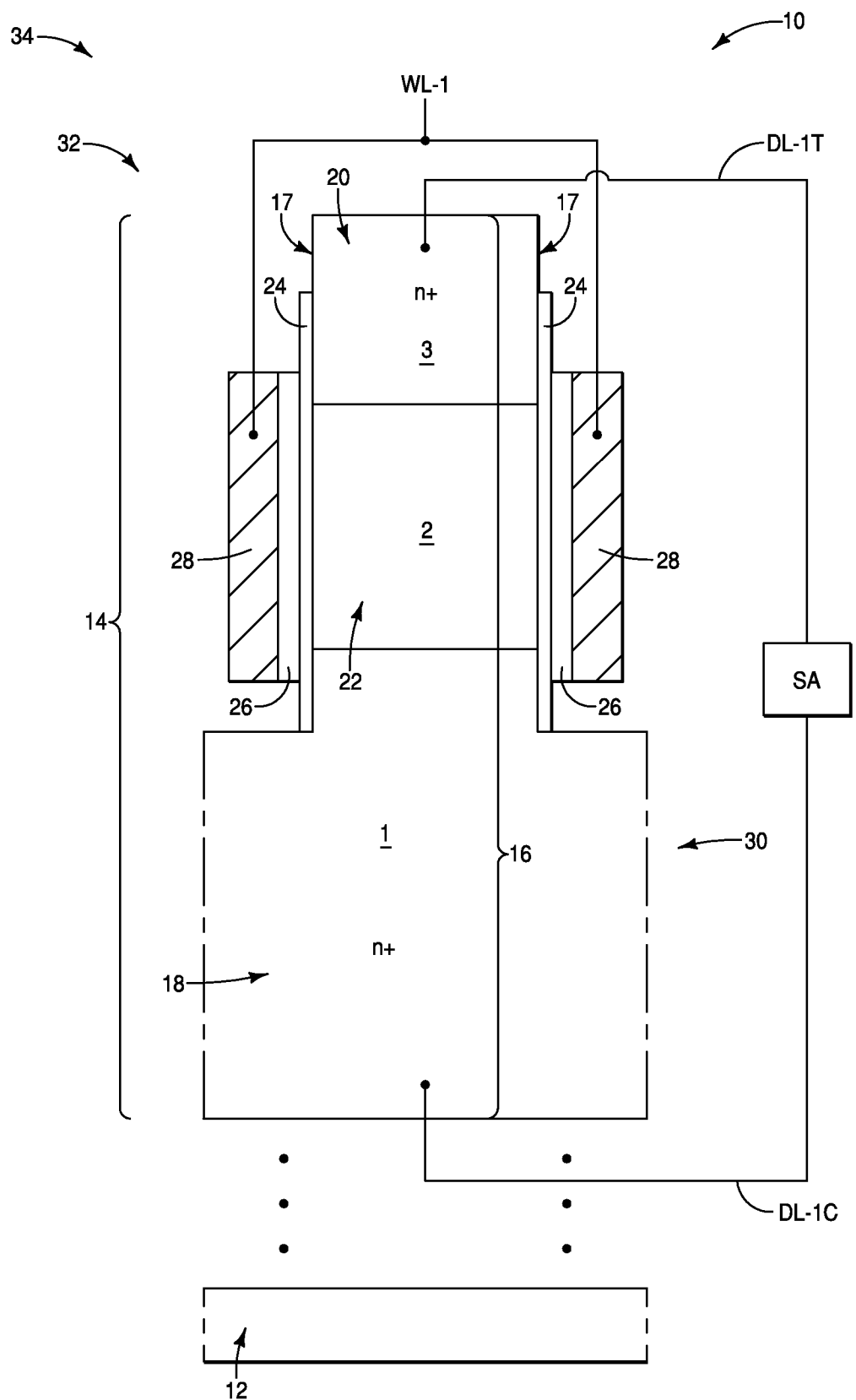
FIG. 1 is a diagrammatic cross-sectional view of a region of an example assembly.
Figure 2:
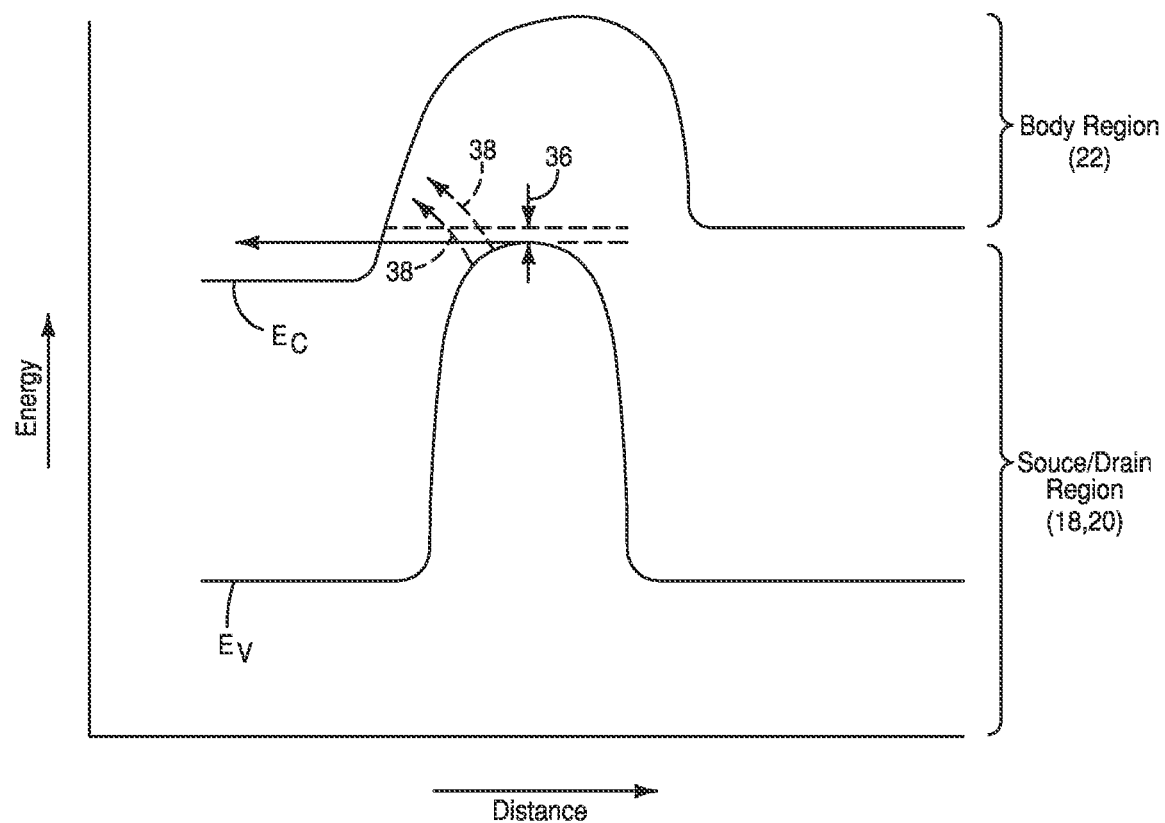
FIG. 2 graphically illustrates a small gap between the energy of a valence band of one material and the energy of a conductive band of an adjacent material in an example embodiment.

Some embodiments include recognition that a problem with conventional ferroelectric transistors is that the body regions of such transistors may be "floating", and thus may be isolated from a source of carrier (either holes or electrons). Such can become problematic during programming operations, in that a limiting factor in the speed of the programming operations may be the rate at which carriers are refreshed within the body regions of the transistors. The ferroelectric transistors may be p-channel devices (i.e., may have p-type source/drain regions, and have the channels operated to conduct holes between the p-type source/drain regions), or may be n-channel devices (i.e., may have n-type source/drain regions, and have the channels operated to conduct electrons between n-type source/drain regions). The source/drain regions may provide one type of carrier to the body region of a ferroelectric transistor during programming operations (holes for p-channel devices, electrons for n-channel devices), but the other type of carrier will come from bulk material adjacent the body region. In conventional structures the floating body region is too isolated from the bulk material for rapid replenishment of such other type of carrier, and performance suffers. Some embodiments include heterostructure active regions which enable interband tunneling during replenishment of carrier to thereby improve performance (e.g., to increase programming speed). Example embodiments are described with reference to FIGS. 1-10.

As a preliminary matter, it is noted that some of the figures show various different dopant levels; and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration of less than or equal to about $10^{16}$ atoms/cm$^3$. Regions identified as being n−, n and n+ will have dopant concentrations similar to those described above relative to the p−, p and p+ regions respectively, except, of course, the n regions will have an opposite-type conductivity-enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

Referring to FIG. 1, an integrated assembly 10 includes a ferroelectric transistor 14 supported by a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the ferroelectric transistor 14 to indicate that there may be other materials, circuit components, etc., provided between the base and the ferroelectric transistor 14 in some embodiments.

The ferroelectric transistor 14 comprises an active region 16. The active region includes a first (or lower) source/drain region 18, a second (or upper) source/drain region 20, and a body region (or channel region) 22 between the source/drain regions 18 and 20. In the illustrated embodiment, the active region 16 extends vertically relative to the base 12 (i.e., the source/drain regions 18 and 20 are vertically opposed relative to one another). In other embodiments, the active region may have a different configuration relative to the base 12 (e.g., the source/drain regions may be horizontally opposed relative to one another).

The active region 16 comprises semiconductor material and is a heterostructure configuration; with the term "heterostructure configuration" meaning that at least one of the source/drain regions 18 and 20 is different in semiconductor composition relative to the body region 22. In some embodiments, both of the source/drain regions 18 and 20 are different in semiconductor composition relative to the body region 22. In the shown embodiment, the first source/drain region 18 comprises a semiconductor composition "1", the body region 22 comprises a semiconductor composition "2", and the second source/drain region 20 comprises a semiconductor composition "3".

The semiconductor compositions 1, 2 and 3 may be any suitable compositions; and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). The source/drain semiconductor compositions 1 and 3 may be the same as one another in some embodiments, and may be different relative to one another in other embodiments.

The ferroelectric transistor 14 includes insulative material 24 extending along the body region 22, includes ferroelectric material 26 adjacent the insulative material, and includes conductive gate material 28 adjacent the ferroelectric material.

The insulative material 24 may comprise any suitable composition(s), and in some embodiments may comprise, consist essentially of, or consist of silicon dioxide.

The ferroelectric material 26 may comprise any suitable composition(s); and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric material may be provided in any suitable configuration; such as, for example, a single homogeneous material, or a laminate of two or more discrete separate materials.

The conductive material 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 28 may be a metal-containing material; such as, for example, a material comprising one or more of titanium nitride, tungsten nitride, tungsten, titanium, etc. The conductive material 28 may comprise any suitable work function.

In the shown embodiment, the vertically-extending active region 16 has a pair of opposing sidewalls 17 along the cross-section of FIG. 1. The sidewalls 17 extend along the body region 22, the upper source/drain region 20, and an upper portion of the lower source/drain region 18. In the shown embodiment, the lower source/drain region 18 is along a conductive line 30 that extends along the plane of the cross-section of FIG. 1, with only a portion of such conductive line being shown. The conductive line may be part of a digit line, as discussed in more detail below.

The insulative material 24 is along the opposing sidewalls 17, and the ferroelectric material 26 and conductive gate material 28 may also be considered to be along such sidewalls. The materials 24, 26 and 28 may have any suitable vertical dimensions relative to the illustrated active region 16. The insulative material 24 may extend along the entirety of the sidewalls 17, or may extend along only portions of such sidewalls. The ferroelectric material 26 may extend vertically beyond the conductive gate material 28, or not; and in the shown embodiment has about the same vertical dimensions as the conductive gate material 28. The conductive gate material may overlap interfaces where the body region 22 joins to the source/drain regions 18 and 20, as shown.

The ferroelectric transistor 14 may be utilized as a memory cell 32 of a memory array 34. In such applications, the conductive gate material 28 may be coupled with a wordline WL-1, the upper source/drain region 20 may be coupled with a first comparative digit line DL-1T, and the lower source/drain region 18 may be coupled with a second comparative digit line DL-1C. The comparative digit lines DL-1T and DL-1C extend to a sense amplifier SA. The comparative digit lines DL-1T and DL-1C may be considered to correspond to a set of paired digit lines (DL-1T/DL-1C). The set comprises a true digit line (DL-1T) and a complementary digit line (DL-1C). The terms "true" and "complementary" are arbitrary. The electrical values of the true and complementary digit lines of the set are utilized together during reading/writing operations of memory cells (e.g., 32) associated with such set. In some embodiments, the true comparative digit line (DL-1T) may be referred to as a first comparative digit line, and the complementary comparative digit line (DL-1C) may be referred to as a second comparative digit line.

The source/drain regions 18 and 20 are shown to be heavily-doped with n-type dopant (specifically, are labeled as "n+" regions). Accordingly, the ferroelectric transistor 14/memory cell 32 is an n-channel device. The body region 22 may or may not be doped; and if doped may be doped to any suitable dopant type/level. For instance, the body region 22 may be doped to an intrinsic level, a "p-" level, a "p" level, a "p+" level an "n-" level, etc., relative to the illustrated embodiment in which the ferroelectric transistor 14/memory cell 32 is an n-channel device.

The n-channel memory cell 32 may be programmed into a first memory state (a so-called "1" state) by operating the wordline WL-1 and the digit line set DL-1T/DL-1C to form electrons within the body region 22 (and specifically adjacent the wordline WL-1). The electrons may be provided by the n-type-doped source/drain regions 18 and 20. The memory state "1" may be considered to correspond to a state in which holes are depleted within the body region 22. The memory cell 32 may be programmed into a second memory state (a so-called "0" state) by operating the wordline WL-1 and a digit line set DL-1T/DL-1C to replenish holes within the body region 22 (and specifically adjacent the wordline WL-1).

A difficulty encountered with conventional ferroelectric transistors is that it may be difficult to replenish the holes within the body region 22 due to a lack of an efficient transfer mechanism for bringing holes across the source/drain regions 18 and 20. The heterostructure configuration of the active region 16 can enable inter-band tunneling between the body region 22 and an adjacent source/drain region to enable the replenishment of the holes within the body region. For instance, FIG. 2 graphically illustrates energy levels of a valence band ($E_V$) of a semiconductor composition within the body region 22, and a conduction band ($E_C$) of a semiconductor composition within one or both of the source/drain regions 18 and 20. When no external bias voltage bias is applied, an energy gap 36 between the conduction band Ec and the valence band Ev is small enough (or Ev in channel region is higher than Ec in S/D) such that when voltage bias is applied it can enable carrier (e.g., holes) to tunnel from at least one of the source/drain regions to the body region, with such tunneling being diagrammatically illustrated with the arrows 38. In some embodiments, the semiconductor material within the body region 22 may comprise Ge or GeSi, (where the chemical formula indicates primary constituents rather than a specific stoichiometry); and the semiconductor material within the adjacent source/drain region may comprise Si.

Although the memory cell 32 is shown and described as an n-channel device, in other embodiments it may be a p-channel device. In such other embodiments, the same considerations discussed above will apply, except that it will be the electrons which are replenished through inter-band tunneling. In some embodiments, the source/drain regions 18 and 20 may be considered to be heavily-doped to a first conductivity type, and the heterostructure configuration of the active region 16 may be considered to enable replacement of carrier of a second conductivity type within the body region through inter-band tunneling between the body region and an adjacent source/drain region; with one of the first and second conductivity types being p-type and the other being n-type.

The active region 16 may have any suitable heterostructure configuration. In some example embodiments, the n-channel ferroelectric transistor 14 may have a body region 22 which comprises germanium with or without silicon, and may have source/drain regions 18 and 20 which include silicon with or without germanium. The germanium concentration within the body region 22 may be higher than any germanium concentration within either of the first and second source/drain regions 18 and 20. In some example embodiments, the germanium concentration within the body region 22 may be within a range of from about 10 atomic percent to about 100 atomic percent; and the germanium concentration within the source/drain regions 18 and 20 may be within a range of from about 0 atomic percent to about 50 atomic percent.

In some embodiments, the ferroelectric transistor 14 may be considered to be representative of many substantially identical ferroelectric transistors across the memory array 34 and corresponding to memory cells 32; the first and second comparative digit lines DL-1T and DL-1C are together a paired set DL-1T/DL-1C which may be representative of many substantially identical paired sets of first and second comparative digit lines across the memory array; and the wordline WL-1 may be representative of many substantially identical wordlines across the memory array. The term "substantially identical" means identical to within reasonable tolerances of fabrication and measurement. Example memory arrays are described with reference to FIGS. 3 and 4.

Figure 3:
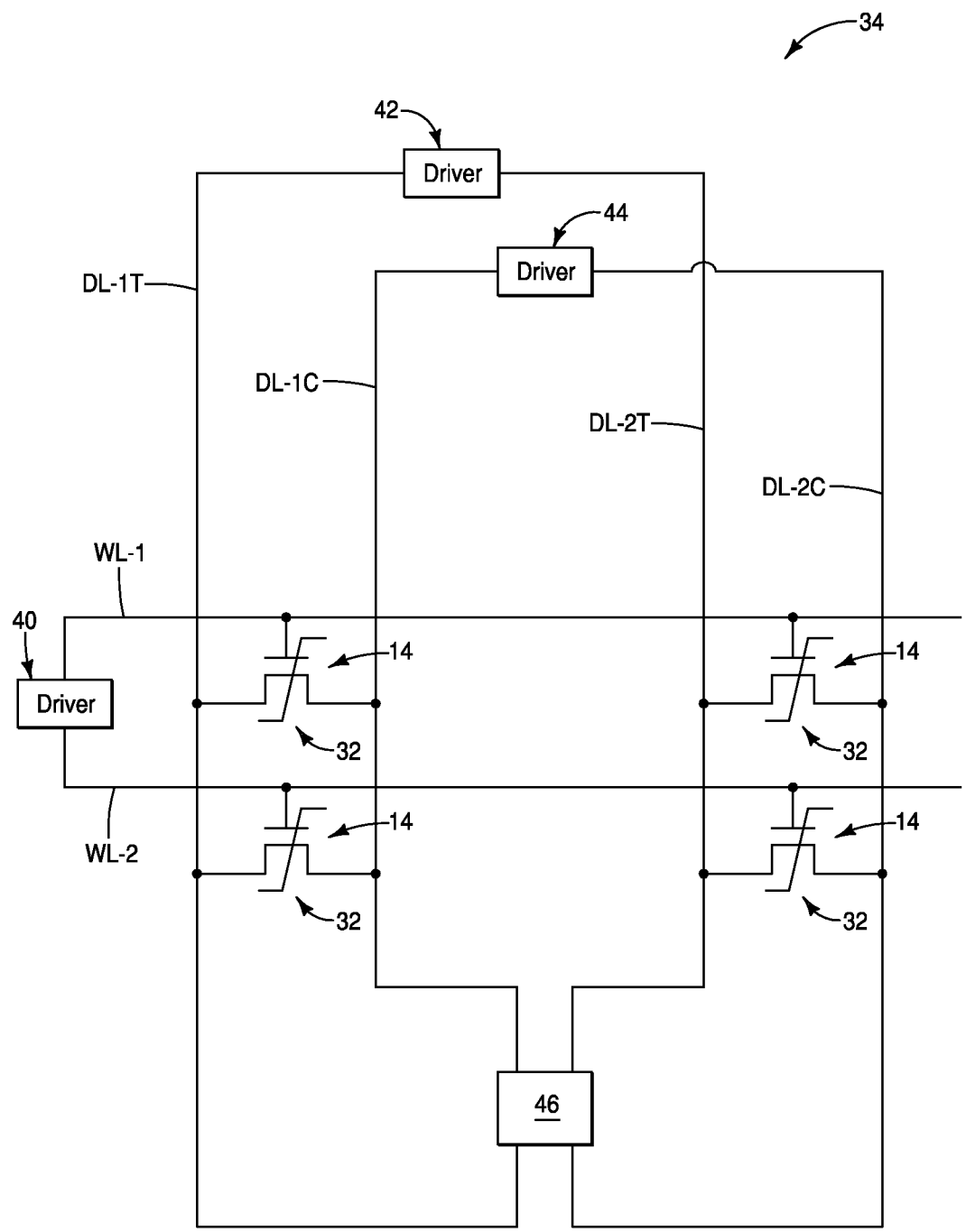
FIGS. 3 and 4 are schematic views of regions of example memory arrays.

Referring to FIG. 3, an example memory array 34 includes a plurality of memory cells 32, which each comprises a ferroelectric transistor 14. Wordlines WL-1 and WL-2 are coupled with a first driver 40 (i.e., wordline driver, driver circuitry, row driver circuitry, etc.), and extend along rows of the memory array. Digit line pairs DL-1T/DL-1C and DL-2T/DL-2C extend along columns of the memory array. The true (i.e., first) comparative digit lines DL-1T and DL-2T are coupled with a first digit line driver 42 (i.e., first digit line driver circuitry, first column driver circuitry, etc.), and the complementary (i.e., second) comparative digit lines DL-1C and DL-2C are coupled with a second digit line driver 44 (i.e., second digit line driver circuitry, second column driver circuitry, etc.). Each of the memory cells 32 is uniquely addressed through a combination of one of the wordlines and one of the sets of first and second comparative digit lines.

The true and complementary comparative digit lines (e.g., DL-1T and DL-1C) of each of the paired digit line sets (e.g., DL-1T/DL-1C) are electrically coupled with a device 46. Such device 46 may be a sense amplifier utilized to compare electrical properties of a true digit line (e.g., DL-1T) with those of a comparative digit line (e.g., DL-1C) during a READ operation. Alternatively, or additionally, the device 46 may be utilized to impart desired electrical properties to the true and complementary comparative digit lines (e.g., DL-1T and DL-1C) during a programming (i.e., WRITE) operation. Although both the paired digit line sets are shown extending to the same device 46, in other embodiments one of the digit line sets may extend to a different device than does the other.

Figure 4:
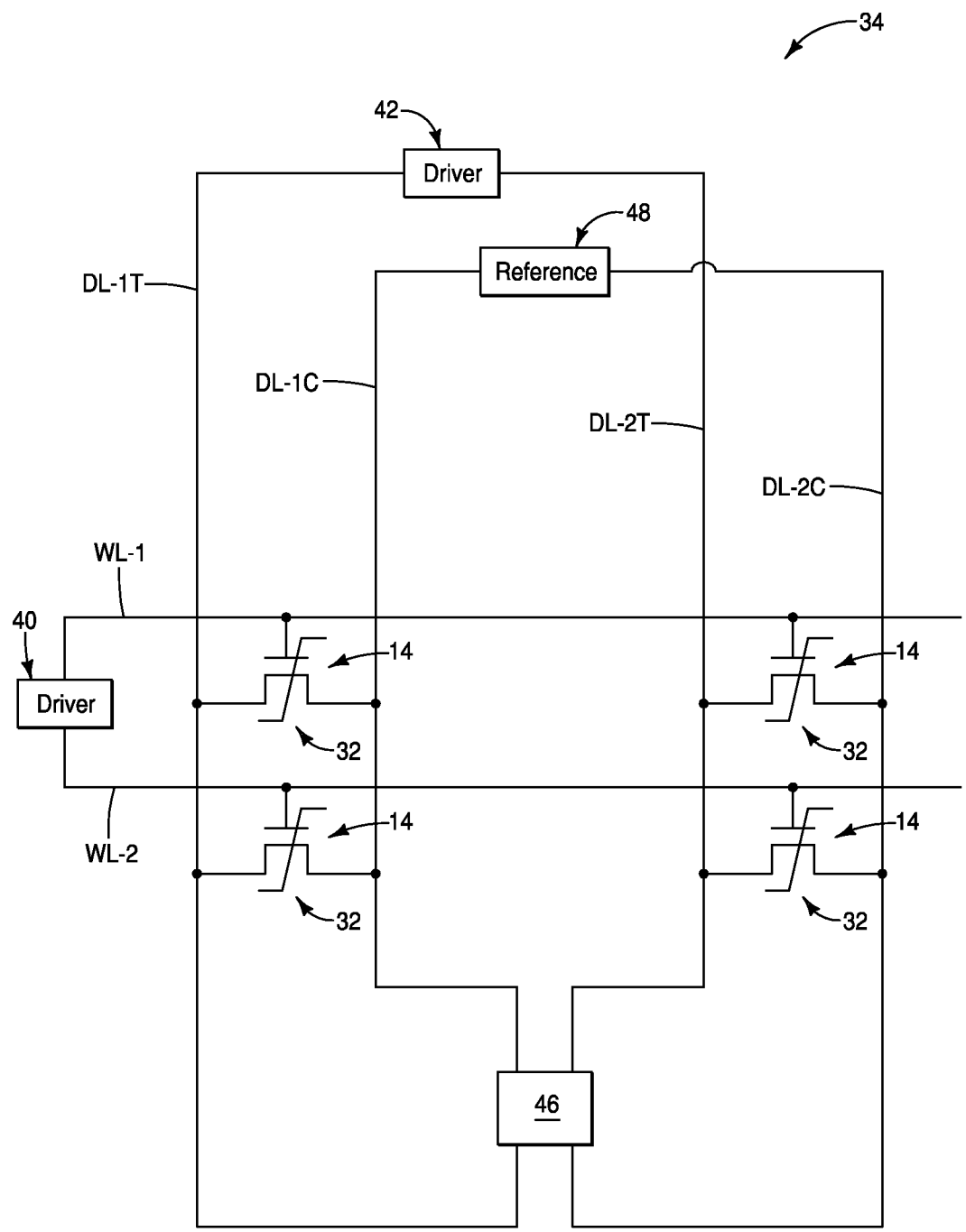

Referring to FIG. 4, the example memory array 34 includes the plurality of memory cells 32, the wordlines WL-1 and WL-2, and the digit line pairs DL-1T/DL-1C and DL-2T/DL-2C. The memory array of FIG. 4 differs from that of FIG. 3 in that the complementary (i.e., second) comparative digit lines DL-1C and DL-2C are coupled with a common reference 48. The common reference 48 may be any suitable structure held at any suitable common reference voltage. For instance, the reference structure may be a wire, plate, etc.; and the common reference voltage may be ground, VCC/2, etc.

Figure 5A:
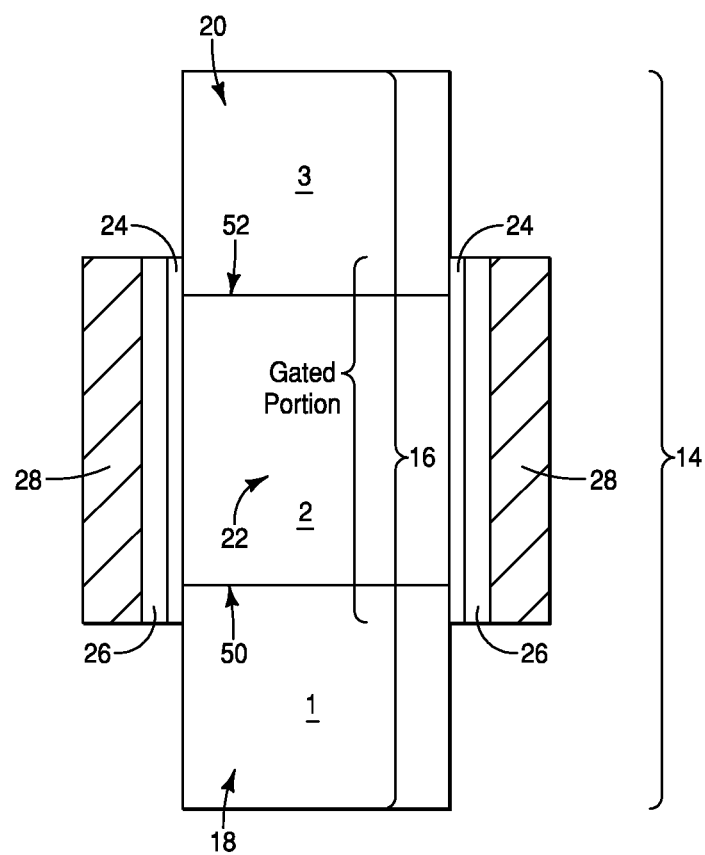
FIG. 5A is a diagrammatic cross-sectional view of a region of an example assembly.

FIG. 1 shows the ferroelectric transistor 14 having only a portion of the active region 16 vertically overlapped by the conductive gate material 28. In some embodiments, the portion of the active region 16 overlapped by the conductive gate material 28 may be referred to as a gated portion of the active region 16, and other portions of the active region 16 be referred to as non-gated portions. FIG. 5A shows a region of an example ferroelectric transistor 14 having a gated portion. The illustrated region of the ferroelectric transistor comprises the body region 22, and the source/drain regions 18 and 20; with the body region comprising the semiconductor composition 2, and the source/drain regions 18 and 20 comprising the semiconductor compositions 1 and 3. The gated portion overlaps an interface 50 between the semiconductor compositions 2 and 3, and also overlaps an interface 52 between the semiconductor compositions 1 and 2.

Figure 5B:
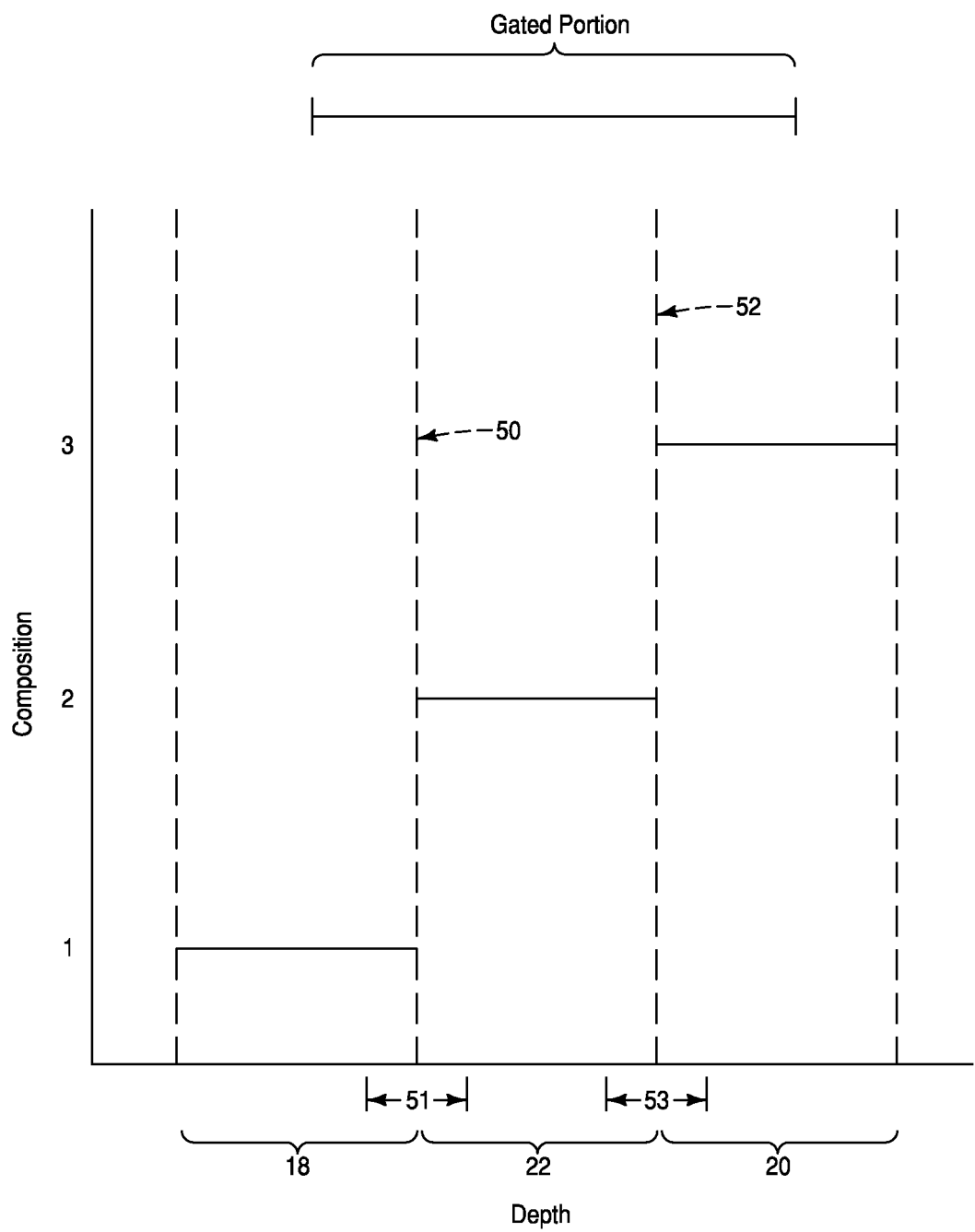
FIG. 5B is a graphical view of composition versus depth for a portion of the assembly of FIG. 5A.

In some embodiments, the interfaces 50 and 52 may comprise abrupt transitions from the semiconductor composition of the body region 22 (i.e., the composition 2) to the semiconductor compositions of the source/drain regions 18 and 20 (i.e., the compositions 1 and 3). FIG. 5B graphically illustrates such abrupt transitions. Specifically, FIG. 5B shows an abrupt transition from composition 1 to composition 2 along the interface 50, and shows another abrupt transition from composition 2 to composition 3 along the interface 52. The term "abrupt transition" may be understood to mean a transition which occurs across a very short distance; which may include, but is not limited to, transitions in which there is no mixing of adjacent compositions across the interface. FIG. 5B shows distances 51 and 53 which may correspond to regions where compositions mix across the interfaces 50 and 52 relative to the illustrated abrupt transitions occurring at such interfaces. In some embodiments, the distances 51 and 53 may be less than or equal to about 50 Å, less than or equal to about 30 Å, less than or equal to about 20 Å, etc., for the abrupt transitions described herein.

In the illustrated embodiment of FIG. 5B both of the abrupt transitions corresponding to interfaces 50 and 52 are within the gated portion of the active region 16.

Figure 6A:
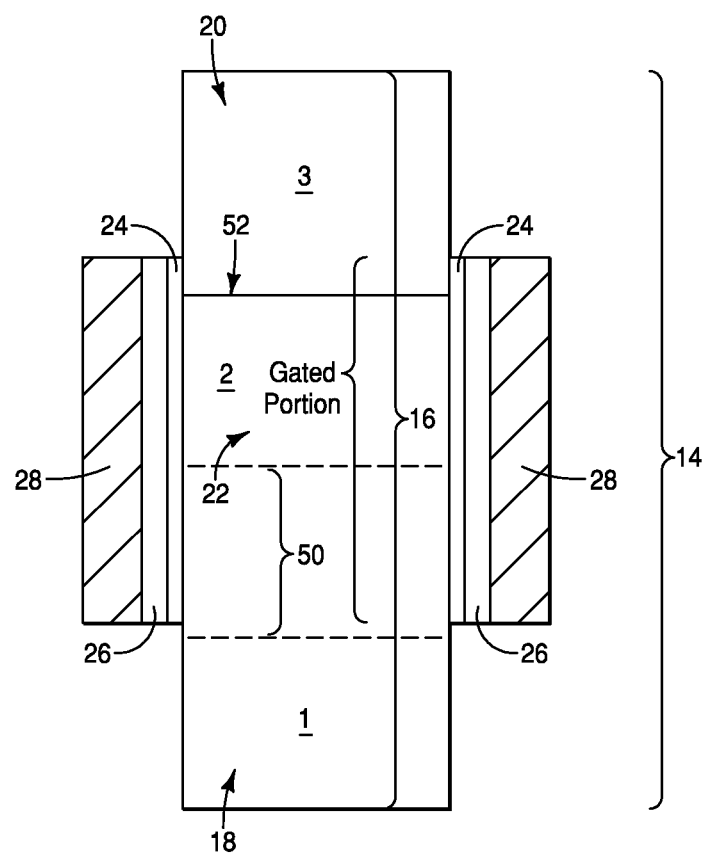
FIG. 6A is a diagrammatic cross-sectional view of a region of an example assembly.
Figure 6B:
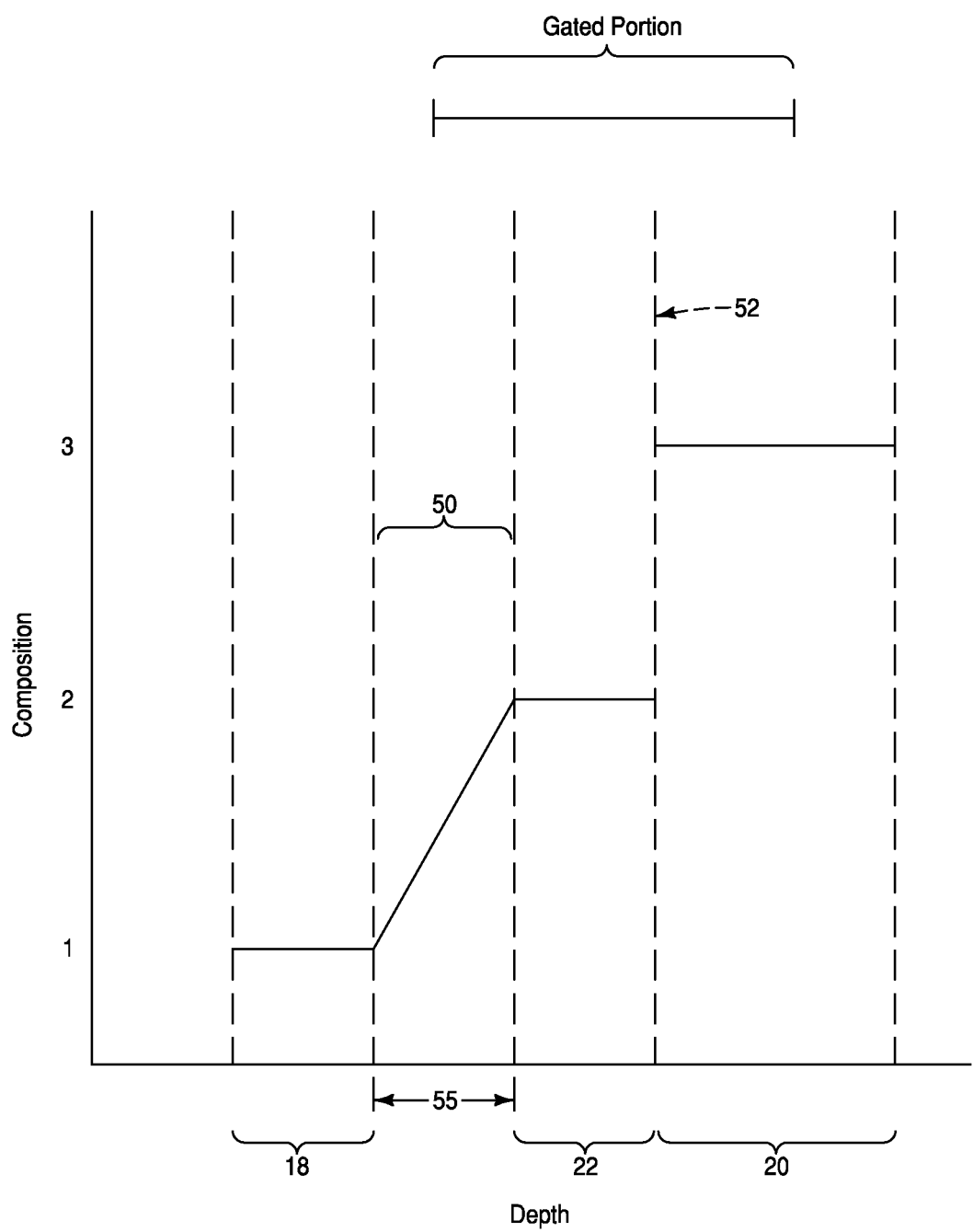
FIG. 6B is a graphical view of composition versus depth for a portion of the assembly of FIG. 6A.

In some embodiments, at least one of the interfaces 50 and 52 may be a graded transition. For instance, FIGS. 6A and 6B show a graded transition along the interface 50 and an abrupt transition along the interface 52. In in the shown embodiment, the abrupt transition is within the gated portion of the active region 16; and part of the graded transition is within the gated portion while another part is not within the gated portion. FIG. 6B shows the graded transition 50 occurring over a distance 55, with part of such distance being within the gated portion and another part being outside of the gated portion. The distance 55 may correspond to a distance across which the composition 1 of the source/drain region 18 mixes with the composition 2 of the body region 22.

The term "graded transition" means a transition occurring over a relatively long distance as compared to the relatively short distance of the abrupt transition. In some embodiments, a graded transition may occur over a distance of at least about 100 Å, at least about 200 Å, at least about 500 Å, etc.

An advantage of the graded transition may be that such may alleviate leakage from memory cells while the memory cells are in a RESTING state (i.e., while the memory cells are not being programmed); and/or may be otherwise useful in some READ/WRITE arrangements.

Figure 7:
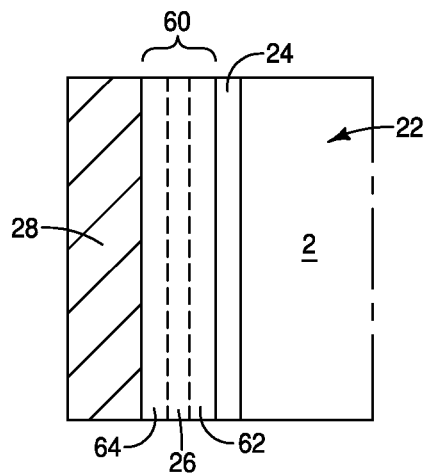
FIGS. 7-9 are diagrammatic cross-sectional views of regions of example assemblies.
Figure 8:
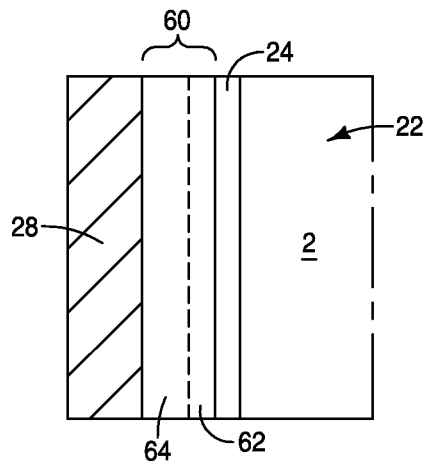
Figure 9:
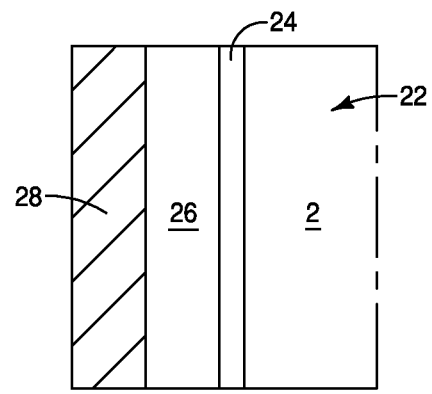

The ferroelectric material 26 may be utilized in MFMIS configurations, MFIS configurations, or any other suitable configurations. FIGS. 7-9 illustrate a few example configurations.

FIG. 7 shows a configuration in which the ferroelectric material 26 is within a stack 60 comprising the ferroelectric material between a pair of metal-containing materials 62 and 64 (so-called MFM stacks). Dashed lines are utilized to diagrammatically illustrate approximate boundaries between the various materials within the stack 60. The metal-containing materials 62 and 64 may comprise any suitable metals or metal-containing compositions; including, for example, one or more of tungsten, titanium, titanium nitride, etc. In some embodiments, the metal-containing material 62 may be referred to as an intervening conductive material between the ferroelectric material 26 and the insulative material 24.

FIG. 8 shows a configuration similar to that of FIG. 7, except that the stack 60 only comprises the metal-containing material 64 and the ferroelectric material 26. The configuration of FIG. 8 may be considered to be an example of an MFIS configuration.

FIG. 9 shows a configuration in which the ferroelectric material 26 is the only material between the insulative material 24 and the conductive gate material 28. The conductive gate material 28 may comprise metal adjacent the ferroelectric material 26, and accordingly FIG. 9 may be considered to be another example of an MFIS configuration. It is noted that FIGS. 8 and 9 are basically the same configuration as one another, with the only difference being whether the metal of the MFIS configuration is defined as being part of the gate material 28, or is instead defined as being part of a separate stack 60. Analogously, the MFMIS configuration of FIG. 7 may include material of the gate 28 as the first metal of the MFMIS structure, rather than having such metal being considered to be part of the stack 60.

Figure 10:
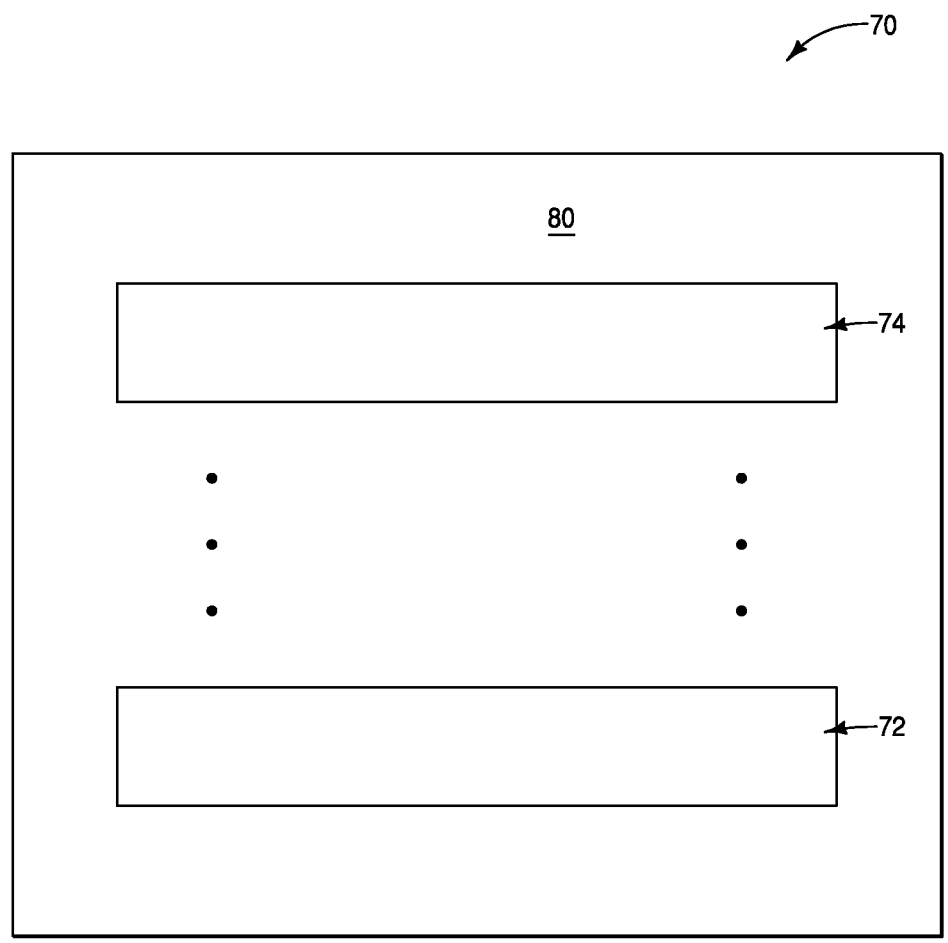
FIG. 10 is a diagrammatic cross-sectional view of a region of an example package.

In some embodiments, memory cells 32 of the type described above with reference to FIG. 1 and be incorporated into memory arrays of multi-deck packages. For instance, FIG. 10 shows a multi-deck package 70 which includes a first deck 72 and a second deck 74 vertically offset from the first deck (and in the shown embodiment, above the first deck). A gap is shown between the first and second decks to indicate that there may be other components provided between the decks.

The first deck 72 may be a memory deck comprising memory cells 32; and may, for example, comprise a memory array 34 analogous to one of those described above with reference to FIGS. 3 and 4.

The second deck 74 may also be a memory deck, and may comprise memory cells substantially identical to the memory cells utilized in the first memory deck (e.g., may also comprise memory cells 32). Alternatively, the second deck 74 may be a memory deck comprising memory cells of a different configuration relative to the memory cells utilized in the first memory deck 72.

Encapsulant 80 is shown extending around the memory decks 72 and 74 of the package 70. Such encapsulant may comprise any suitable composition(s).

The ferroelectric transistors described herein may be incorporated into memory cells as described in the example embodiments presented herein, or may be utilized in any other suitable applications; including, for example, sensors, logic, processors, etc.

The ferroelectric transistors described herein may have any suitable configuration, including, for example, finFET devices, surround gate devices, planar devices, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a ferroelectric transistor having an active region which includes a first source/drain region, a second source/drain region, and a body region between the first and second source/drain regions. The body region has a different semiconductor composition than at least one of the first and second source/drain regions to enable replenishment of carrier within the body region through inter-band tunneling between the body region and said at least one of the source/drain regions. An insulative material is along the body region. A ferroelectric material is along the insulative material. A conductive gate material is along the ferroelectric material.

Some embodiments include an integrated assembly having a ferroelectric transistor. The ferroelectric transistor includes a vertically-extending active region which has a first source/drain region, a second source/drain region, and a body region between the first and second source/drain regions. The body region comprises a different semiconductor composition than either of the first and second source/drain regions. The source/drain regions are heavily doped to a first conductivity type. The different semiconductor composition of the body region relative to the first and second source/drain regions enables replenishment of carrier of a second conductivity type within the body region through inter-band tunneling between the body region and the source/drain regions. One of the first and second conductivity types is n-type and the other is p-type. A first comparative digit line is coupled with the first source/drain region. A second comparative digit line is coupled with the second source/drain region Some embodiments include an integrated assembly having a ferroelectric transistor. The ferroelectric transistor comprises a vertically-extending active region which includes a first source/drain region, a second source/drain region, and a body region between the first and second source/drain regions. The body region comprises a different semiconductor composition than either of the first and second source/drain regions. The active region has a pair of opposing sidewalls along a cross-section. An insulative material is along each of the opposing sidewalls. A ferroelectric material is adjacent the insulative material. A conductive gate material is adjacent the ferroelectric material. A first comparative digit line is coupled with the first source/drain region. A second comparative digit line is coupled with the second source/drain region. A portion of the active region overlapped by the conductive gate material is a gated portion of the active region. The semiconductor composition of the body region transitions to the semiconductor composition of one of the source/drain regions along an abrupt transition region. The abrupt transition region is within the gated portion of the active region. The semiconductor composition of the body region transitions to the semiconductor composition of the other of the source/drain regions along a graded transition region. A part of the graded transition is within the gated portion of the active region, and another part of the graded transition region is not within the gated portion of the active region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a ferroelectric transistor; the ferroelectric transistor comprising an active region which includes a first source/drain region, a second source/drain region, and a body region between the first and second source/drain regions;
the body region comprising a different semiconductor composition than either of the first and second source/drain regions; the different semiconductor composition of the body region relative to the first and second source/drain regions enabling replenishment of carrier within the body region through inter-band tunneling between the body region and the source/drain regions;
a first comparative digit line coupled with the first source/drain region; and
a second comparative digit line coupled with the second source/drain region.

2. The integrated assembly of claim 1 wherein one of the first and second source/drain regions is an upper source/drain region and the other of the first and second source/drain regions is a lower source/drain region.

3. The integrated assembly of claim 2 wherein the ferroelectric transistor comprises, along the cross-section:
a pair of opposing sidewalls along the body region, the upper source/drain region and a portion of the lower source/drain region;
an insulative material along each of the opposing sidewalls;
a ferroelectric material adjacent the insulative material; and
a conductive gate material adjacent the ferroelectric material.

4. The integrated assembly of claim 3 wherein:
the ferroelectric transistor is one of many substantially identical ferroelectric transistors within a memory array and corresponding to memory cells;
the conductive gate material is coupled with a wordline which is one of many substantially identical wordlines;
the first and second comparative digit lines are together a paired set of first and second comparative digit lines, with the paired set being one of many substantially identical paired sets of first and second comparative digit lines; and
each of the memory cells is uniquely addressed through a combination of one of the wordlines and one of the sets of first and second comparative digit lines.

5. The integrated assembly of claim 4 wherein the first and second comparative digit lines of each set are coupled to a sense amplifier.

6. The integrated assembly of claim 4 wherein:
the memory array is along a first memory deck and is part of a package; and
a second memory deck is within the package and is vertically offset relative to the first memory deck.

7. The integrated assembly of claim 1 comprising an abrupt transition from the semiconductor composition of the body region to the semiconductor composition of both of the source/drain regions.

8. The integrated assembly of claim 1 comprising a graded transition from the semiconductor composition of the body region to the semiconductor composition of at least one of the source/drain regions.

9. The integrated assembly of claim 1 comprising an abrupt transition from the semiconductor composition of the body region to the semiconductor composition of one of the source/drain regions, and comprising a graded transition from the semiconductor composition of the body region to the semiconductor composition of the other of the source/drain regions.

10. The integrated assembly of claim 1 wherein the first and second source/drain regions comprise different semiconductor compositions relative to one another.

11. The integrated assembly of claim 1 wherein the first and second source/drain regions comprise a same semiconductor composition.

12. The integrated assembly of claim 1 wherein the body region comprises germanium with or without silicon; wherein the first and second source/drain regions comprise silicon with or without germanium; and wherein a germanium concentration within the body region is higher than any germanium concentration of either of the first and second source/drain regions.

13. An integrated assembly, comprising:
a ferroelectric transistor; the ferroelectric transistor comprising a vertically-extending active region which includes a first source/drain region, a second source/drain region, and a body region between the first and second source/drain regions; the body region comprising a different semiconductor composition than either of the first and second source/drain regions; the active region having a pair of opposing sidewalls along a cross-section;
an insulative material along each of the opposing sidewalls;
a ferroelectric material adjacent the insulative material;
a conductive gate material adjacent the ferroelectric material;
a portion of the active region overlapped by the conductive gate material being a gated portion of the active region;
the semiconductor composition of the body region transitioning to the semiconductor composition of one of the source/drain regions along an abrupt transition region; the abrupt transition region being within the gated portion of the active region; and
the semiconductor composition of the body region transitioning to the semiconductor composition of the other of the source/drain regions along a graded transition region.

14. The integrated assembly of claim 13 wherein a part of the graded transition is within the gated portion of the active region, and another part of the graded transition region is not within the gated portion of the active region.

15. The integrated assembly of claim 13 wherein the first and second source/drain regions comprise different semiconductor compositions relative to one another.

16. The integrated assembly of claim 13 wherein the first and second source/drain regions comprise a same semiconductor composition.

17. The integrated assembly of claim 13 wherein the body region comprises germanium with or without silicon; wherein the first and second source/drain regions comprise silicon with or without germanium; and wherein a germanium concentration within the body region is higher than any germanium concentration of either of the first and second source/drain regions.

18. A method of forming an integrated assembly, comprising:
forming a ferroelectric transistor comprising a vertically-extending active region which includes a first source/drain region, a second source/drain region, and a body region between the first and second source/drain regions, the body region comprising a different semiconductor composition than either of the first and second source/drain regions; the source/drain regions being heavily doped to a first conductivity type; the different semiconductor composition of the body region relative to the first and second source/drain regions enabling replenishment of carrier of a second conductivity type within the body region through inter-band tunneling between the body region and the source/drain regions; one of the first and second conductivity types being n-type and the other being p-type;
forming a first comparative digit line coupled with the first source/drain region; and
forming a second comparative digit line coupled with the second source/drain region.

19. The method of claim 18 wherein one of the first and second source/drain regions is an upper source/drain region and the other of the first and second source/drain regions is a lower source/drain region, the method further comprising:
forming a pair of opposing sidewalls along the body region, the upper source/drain region and a portion of the lower source/drain region;
forming an insulative material along each of the opposing sidewalls;
forming a ferroelectric material adjacent the insulative material; and
forming a conductive gate material adjacent the ferroelectric material.

20. The method of claim 18 comprising forming an abrupt transition from the semiconductor composition of the body region to the semiconductor composition of at least one of the source/drain regions.

21. The method of claim 18 comprising forming a graded transition from the semiconductor composition of the body region to the semiconductor composition of at least one of the source/drain regions.

22. The method of claim 18 comprising forming an abrupt transition from the semiconductor composition of the body region to the semiconductor composition of one of the source/drain regions, and comprising forming a graded transition from the semiconductor composition of the body region to the semiconductor composition of the other of the source/drain regions.

23. The method of claim 18 wherein the first and second source/drain regions are formed to comprise different semiconductor compositions relative to one another.

* * * * *